US008918993B2

(12) United States Patent
Braden et al.

(10) Patent No.: US 8,918,993 B2
(45) Date of Patent: Dec. 30, 2014

(54) METHOD FOR INSTALLING A GROUND STUD IN COMPOSITE STRUCTURES

(75) Inventors: Stephen M. Braden, Everett, WA (US); John R. Porter, Lynnwood, WA (US); Nick I. Tavernarakis, Lynnwood, WA (US)

(73) Assignee: The Boeing Company, Chicago, IL (US)

( * ) Notice: Subject to any disclaimer, the term of this patent is extended or adjusted under 35 U.S.C. 154(b) by 1012 days.

(21) Appl. No.: 13/012,635

(22) Filed: Jan. 24, 2011

(65) Prior Publication Data

US 2011/0114356 A1 May 19, 2011

Related U.S. Application Data

(60) Division of application No. 11/834,141, filed on Aug. 6, 2007, now Pat. No. 7,886,439, which is a continuation-in-part of application No. 11/304,858, filed on Dec. 15, 2005, now abandoned.

(51) Int. Cl.

| | |
|---|---|
| ***H01R 43/00*** | (2006.01) |
| ***H05K 13/00*** | (2006.01) |
| ***H01R 4/64*** | (2006.01) |
| *H01R 11/12* | (2006.01) |
| *H01R 4/30* | (2006.01) |
| *H01R 13/03* | (2006.01) |

(52) U.S. Cl.

CPC ................ *H01R 4/646* (2013.01); *H01R 11/12* (2013.01); *H01R 43/00* (2013.01); *H01R 4/30* (2013.01); *H01R 13/03* (2013.01)

USPC .................. 29/854; 29/844; 361/218; 439/92

(58) Field of Classification Search

CPC ............ H05F 3/02; H05R 4/30; H05R 4/646; H05R 43/00; F16B 19/06; F16B 39/025

USPC .................. 29/832, 837, 842, 844, 852, 854; 174/51; 361/212, 218, 220; 411/378, 411/399; 439/92, 801

See application file for complete search history.

(56) References Cited

U.S. PATENT DOCUMENTS 3,755,713 A 8/1973 Paszkowski
4,479,163 A 10/1984 Bannink, Jr. et al.

(Continued)

OTHER PUBLICATIONS

USPTO Office Action for U.S. Appl. No. 11/834,141 dated Apr. 30, 2010.

(Continued)

*Primary Examiner* — Donghai D Nguyen

(74) *Attorney, Agent, or Firm* — Yee & Associates, P.C.

(57) ABSTRACT

Apparatus for bleeding electrical charge and methods for installing a ground stud in a composite structure. The apparatus includes a ground stud and a composite structure including a hole. In one embodiment the ground stud engages the hole in the composite structure in a transition fit. In another embodiment the ground stud is countersunk within the composite structure. Embodiments of the present methods include drilling a hole in the composite structure; inserting the ground stud into the hole such that the ground stud is in electrical contact with conductive fibers within the composite structure; securing the ground stud to the composite structure; and attaching a connective device to the ground stud such that the connective device is in electrical contact with the ground stud. In some embodiments the ground stud and the composite structure engage one another in a transition fit. In some embodiments the ground stud includes a pin, and a portion of the pin that contacts the composite structure is non-threaded. In some embodiments the ground stud is countersunk within the composite structure.

8 Claims, 6 Drawing Sheets

(56) References Cited

U.S. PATENT DOCUMENTS

| | | | |
|---|---|---|---|
| 4,502,092 A | | 2/1985 | Bannink, Jr. et al. |
| 4,671,583 A | * | 6/1987 | Olson et al. .................... 439/92 |
| 4,755,904 A | | 7/1988 | Brick |
| 4,760,493 A | | 7/1988 | Pearson |
| 4,855,027 A | | 8/1989 | McCready |
| 4,891,732 A | | 1/1990 | Jones |
| 4,920,449 A | | 4/1990 | Covey |
| 5,175,665 A | | 12/1992 | Pegg |
| 5,795,162 A | | 8/1998 | Lambert |
| 5,845,872 A | | 12/1998 | Pridham et al. |
| 5,865,397 A | | 2/1999 | Herrmann |
| 7,050,286 B2 | | 5/2006 | Pridham et al. |
| 7,307,825 B2 | * | 12/2007 | De La Fuente De Ana et al. ............................ 361/212 |

OTHER PUBLICATIONS

USPTO Notice of Allowance for U.S. Appl. No. 11/834,141 dated Oct. 13, 2010.

* cited by examiner

METHOD FOR INSTALLING A GROUND STUD IN COMPOSITE STRUCTURES

CROSS-REFERENCE TO RELATED APPLICATIONS

This application is a divisional of U.S. application Ser. No. 11/834,141, filed Aug. 6, 2007, now U.S. Pat. No. 7,886,439, which is a Continuation-In-Part of U.S. application Ser. No. 11/304,858, filed Dec. 15, 2005, now abandoned.

BACKGROUND

1. Technical Field

The present disclosure relates to installing ground studs, and more particularly to installing ground studs in composite materials.

2. Description of Related Art

In electronic and electrical equipment, conductive surfaces must be grounded. A ground is a direct electrical connection to the earth, a connection to a particular point in an electrical or electronic circuit, or an indirect connection that operates as the result of capacitance between wireless equipment and the earth or a large mass of conductive material. Electrical grounding is important because it provides a reference voltage level (typically referred to as zero potential or ground potential) against which all other voltages in a system are established and measured.

An effective electrical ground connection also minimizes the susceptibility of equipment to interference, reduces the risk of equipment damage due to lightning, eliminates electrostatic buildup that can damage system components, and helps protect personnel who service and repair electrical, electronic, and computer systems. In effect, an electrical ground drains away any unwanted buildup of electrical charge. When a point is connected to a proper ground that point tends to stay at a constant voltage, regardless of what happens elsewhere in the circuit or system. The earth, which forms the ultimate ground, has the ability to absorb or dissipate an unlimited amount of electrical charge.

A ground can also be a connection to the main chassis of a piece of electronic or electrical equipment. In older appliances and in desktop computers, this is a metal plate, usually copper or aluminum. In some modern equipment, it is a foil run on the main printed circuit board, usually running around the periphery. It provides a point that can be considered to have zero voltage. All other circuit voltages (positive or negative) are measured or defined with respect to it. Ideally, all chassis grounds should lead to earth grounds.

If the electronic or electrical device is not grounded, electrostatic and precipitation static charges cannot bleed off and can develop to high levels causing either sparking around flammable areas or static arcing and noise which will appear on communication equipment. As such, it is important to ensure all electronic and electrical devices are grounded. As technology advances, some new materials lack a good electrical connection, thus making it difficult to ground the system.

Currently composite materials are beginning to be used in an increasing number of products ranging from simple consumer goods to advanced aerospace structures, such as airplanes. Although composite materials are conductive to some degree, they cannot achieve good electrical connection by incidental contact due to non-conductive outer surface layers of the composite build up. (Composite materials consist of two or more materials.) Therefore, what is needed is a system and method for installing a ground stud to composite materials to achieve low resistance grounding and achieve good electrical connections.

SUMMARY

The preferred embodiments of the present ground stud installation on composite structures have several features, no single one of which is solely responsible for their desirable attributes. Without limiting the scope of the present embodiments as expressed by the claims that follow, their more prominent features will now be discussed briefly. After considering this discussion, and particularly after reading the section entitled "Detailed Description of the Preferred Embodiments", one will understand how the features of the present embodiments provide advantages, which include strong electrical contact between the ground stud and the composite structure and reduced likelihood of cracking in the composite structure.

One embodiment of the present ground stud installation on composite structures comprises a method for installing a ground stud in a composite structure. The method comprises the steps of: drilling a hole in the composite structure; inserting the ground stud into the hole such that the ground stud is in electrical contact with conductive fibers within the composite structure; securing the ground stud to the composite structure; and attaching a connective device to the ground stud such that the connective device is in electrical contact with the ground stud. The connective device, the ground stud and the composite structure are configured to allow electrical current to flow from the connective device to the ground stud and then into the composite structure. The connective device, the ground stud and the composite structure are further configured to allow electrical current to flow from the composite structure to the ground stud and then into the connective device. The ground stud and the composite structure engage one another in a transition fit.

Another embodiment of the present ground stud installation on composite structures comprises a method for installing a ground stud in a composite structure. The method comprises the steps of: drilling a hole in the composite structure; inserting the ground stud into the hole such that the ground stud is in electrical contact with conductive fibers within the composite structure; securing the ground stud to the composite structure; and attaching a connective device to the ground stud such that the connective device is in electrical contact with the ground stud. The connective device, the ground stud and the composite structure are configured to allow electrical current to flow from the connective device to the ground stud and then into the composite structure. The connective device, the ground stud and the composite structure are further configured to allow electrical current to flow from the composite structure to the ground stud and then into the connective device. The ground stud includes a pin, and a portion of the pin that contacts the composite structure is non-threaded.

Another embodiment of the present ground stud installation on composite structures comprises apparatus for bleeding electrical charge, comprising a ground stud and a composite structure including a hole. The ground stud engages the hole in the composite structure in a transition fit.

Another embodiment of the present ground stud installation on composite structures comprises a method for installing a ground stud in a composite structure. The method comprises the steps of: drilling a hole in the composite structure; drilling a countersink in the hole to expose conductive fibers within the composite structure; inserting the ground stud into the hole; and attaching a connective device to the ground stud such that the connective device is in electrical contact with the ground stud. The connective device, the ground stud and the composite structure are configured to allow electrical current to flow from the connective device to the ground stud and then into the composite structure. The connective device, the ground stud and the composite structure are further configured to allow electrical current to flow from the composite structure to the ground stud and then into the connective device.

BRIEF DESCRIPTION OF THE DRAWINGS

The preferred embodiments of the present ground stud installation on composite structures will now be discussed in detail with an emphasis on highlighting the advantageous features. These embodiments depict the novel and non-obvious ground stud installation on composite structures shown in the accompanying drawings, which are for illustrative purposes only. These drawings include the following figures, in which like numerals indicate like parts.

DETAILED DESCRIPTION

Figure 1:
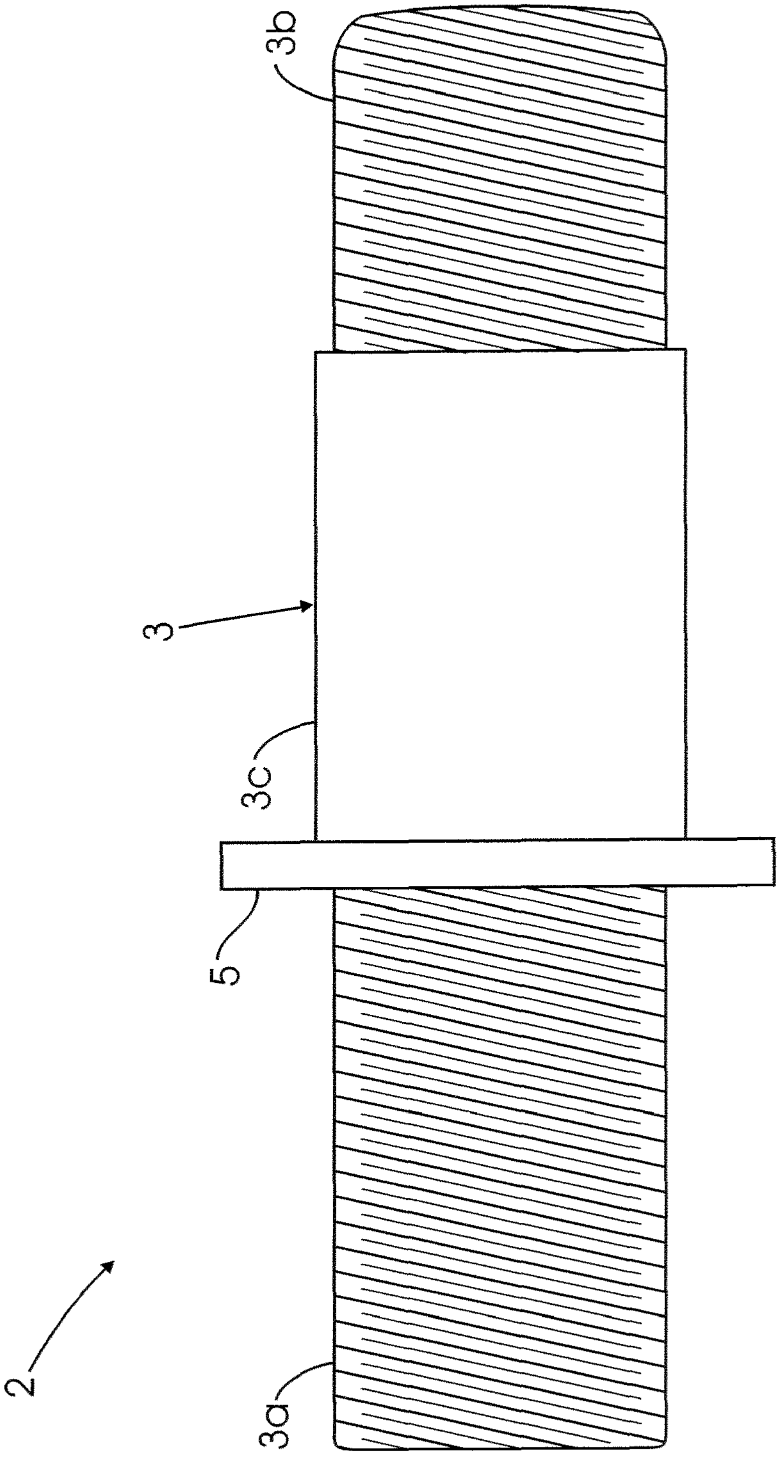
FIG. 1 is a front elevation view of one embodiment of the present ground stud.

FIG. 1 illustrates a ground stud 2, such as a hi-lock fastener, according to one of the present embodiments. Ground stud 2 comprises a pin 3, having a first threaded end 3*a*, a second threaded end 3*b*, and a shoulder 5. An intermediate region 3*c* of the pin 3 between the shoulder 5 and the second threaded end 3*b* is unthreaded. The intermediate region 3*c* also has a slightly larger diameter than either the first threaded end 3*a* or the second threaded end 3*b*.

Figure 3:
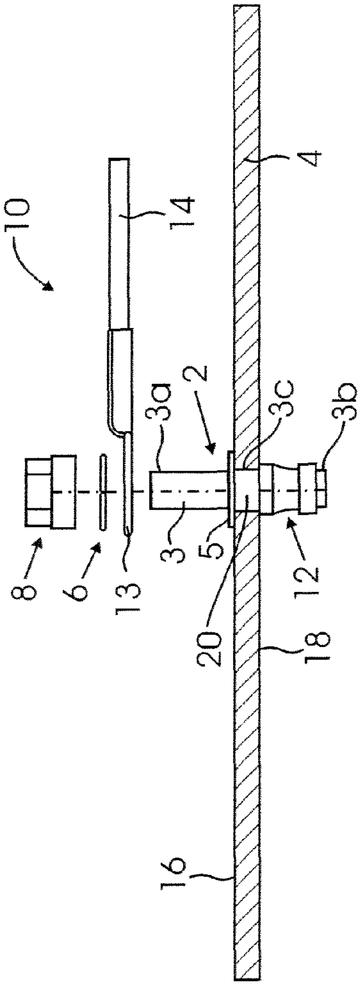
FIG. 3 is an exploded, cross-sectional, front elevation view of the ground stud and composite structure of FIG. 2, taken along the line 3-3 of FIG. 5A.

A coating, such as aluminum pigmented coating, may be applied to either or both threaded ends 3*a* and 3*b* of the pin 3 to facilitate installation of a nut 8 and a collar 12 (FIG. 3). The nut 8 may be self-locking. In one embodiment, the coating applied on the first threaded end 3*a* does not completely cover the first threaded end 3*a*. Rather, a space above the shoulder 5 is left uncoated. In certain embodiments the space is approximately 0.1"+0.030"/−0.000" in length. The uncoated region enhances electrical conductivity between a conductive terminal 13 and the shoulder 5 of the ground stud 2. In addition to providing easier installation, the coating also protects against corrosion and provides a lubricant for making installation with power tools easier, in that the nut 8 and the collar 12 will not seize to the ground stud 2.

Figure 2:
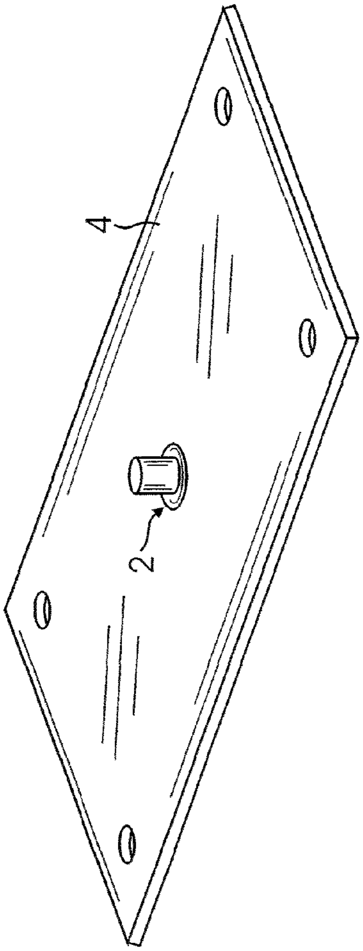
FIG. 2 is a front perspective view of the ground stud of FIG. 1 installed in a composite structure.

FIGS. 2-4 illustrate the ground stud 2 installed in a composite structure 4. The ground stud 2 is installed in the composite structure 4 so that a connection between conductive fibers in the composite structure 4 and the pin 3 has low electrical bonding resistance. The conductive fibers in the composite structure 4 may be, for example, carbon fibers. The ground stud 2 provides an attachment point for electrical connections to the composite structure 4 using a connection device 14 (FIG. 3), such as a bonding jumper, wire, or other type of conductive connector.

To install the ground stud 2 in the composite structure 4, a hole 20 is drilled in the composite structure 4 and the ground stud 2 is inserted into the hole 20. The shoulder 5 abuts a first surface 16 of the composite structure 4 and the unthreaded intermediate portion 3*c* of the pin 3 extends through the hole 20 (FIG. 3). The drilling step advantageously exposes conductive fibers in the composite structure 4, facilitating strong electrical contact between the intermediate portion 3*c* and the composite structure 4. The unthreaded surface of the intermediate portion 3*c* increases the contact area inside the hole 20 between the pin 3 and the composite structure 4 as compared to a threaded configuration, further facilitating strong electrical contact. In certain embodiments, the intermediate portion 3*c* and the composite structure 4 may engage one another in a transition fit or a clearance fit. For example, in one embodiment having a transition fit the hole 20 may have a diameter in the range 0.187"-0.190" and the intermediate portion 3*c* may have a diameter in the range 0.1890"-0.1895". In another embodiment having a clearance fit the hole 20 may have a diameter up to 0.002" larger than a diameter of the intermediate portion 3*c*. The transition/clearance fit for the pin 3 is preferred over an interference fit, which has been found to cause cracking in the composite structure 4.

One embodiment of a method for installing the ground stud 2 within the hole 20 in the composite structure 4 includes the step of ensuring that the ground stud 2 does not spin within the hole 20 during installation of the collar 12. The absence of spinning indicates that the stud 2 is snugly received within the hole 20, ensuring good electrical contact between the stud 2 and the composite structure 4. If the stud 2 is found to spin, the stud 2 is withdrawn from the hole 20, a new, slightly larger hole 20 is drilled, and a larger stud 2 is inserted into the new hole 20. The process is repeated, if necessary, until the ground stud 2 does not spin within the hole 20.

The unthreaded surface of the intermediate portion 3*c* and the transition/clearance fit between the pin 3 and the hole 20 achieves an electrical bonding resistance of less than 1 ohm. This advantageously low resistance enables electrostatic and precipitation type charges to be bled off through the pin 3 and the composite structure 4. This advantageously low resistance also may be maintained through the defined life of the pin 3 and the composite structure 4.

FIG. 3 illustrates an exploded view of a ground stud system 10 according to the present embodiments. As discussed above, the ground stud 2 is inserted through a hole 20 in the composite structure 4 such that the shoulder 5 abuts the first surface 16. The collar 12 engages the second threaded end 3*b* and a second surface 18 of the composite structure 4 to secure the two components together. The smooth intermediate portion 3*c* of the ground stud 2 makes strong electrical contact with conductive fibers within the composite structure 4. The pin 3 is preferably made of an electrically conductive material that will not electro-chemically react to the conductive fibers. For example, if the conductive fibers are carbon fibers, then the pin 3 may be constructed of titanium or steel. Those of ordinary skill in the art will appreciate that other materials could be used instead, and the foregoing examples should not be interpreted as limiting.

In the illustrated embodiment, the connective device 14 comprises a conductive terminal 13 that fits over and at least partially around the ground stud 2. Electrostatic current may flow from the connective device 14 to the ground stud 2 and the composite structure 4. In the illustrated embodiment, a pressure washer 6 and nut 8 engage the first threaded end 3*a* and sandwich the conductive terminal 13 between the washer 6 and the shoulder 5. The nut 8 may be self-locking.

Figure 4A:
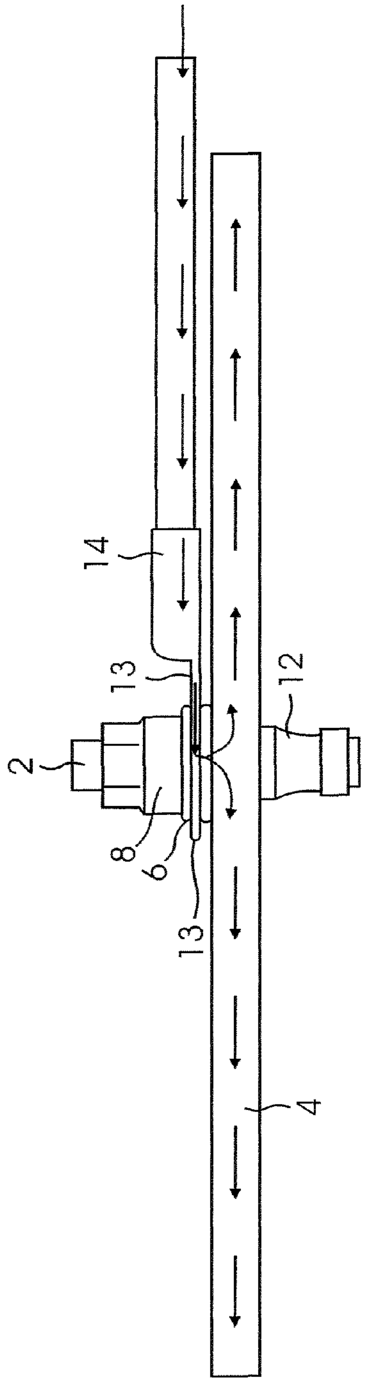
FIG. 4A is an assembled front elevation view of the ground stud and composite structure of FIG. 3, illustrating current flowing in a first direction.

FIG. 4A illustrates the path of electrical current flow from the connection device 14 to the composite structure 4. When an electrical current is introduced into the connection device 14, charge flows through the connection device 14 to the conductive terminal 13, which is in electrical contact with the shoulder 5 of the ground stud 2. The shoulder 5 is in electrical contact with the intermediate portion 3*c* of the pin 3, which is in electrical contact with the conductive fibers within the composite structure 4. Current thus flows from the connection device 14 to the conductive terminal 13, then to the shoulder 5, then to the intermediate portion 3*c* and finally into the composite structure 4.

Figure 4B:
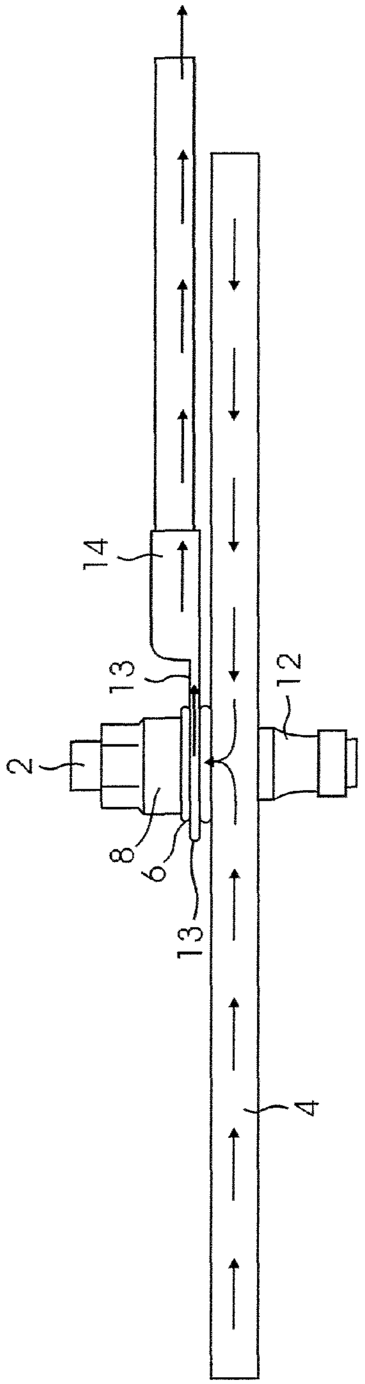
FIG. 4B is an assembled front elevation view of the ground stud and composite structure of FIG. 3, illustrating current flowing in a second direction.

In the present embodiments, charge may also flow in a direction opposite to that shown in FIG. 4A, such as when a static charge builds up in the composite structure 4. FIG. 4B illustrates the path of electrical current flow from the composite structure 4 to the connection device 14. Current flows from the composite structure 4 to the intermediate portion 3*c* and the shoulder 5, then to the conductive terminal 13 and finally out through the connection device 14.

Figure 5A:
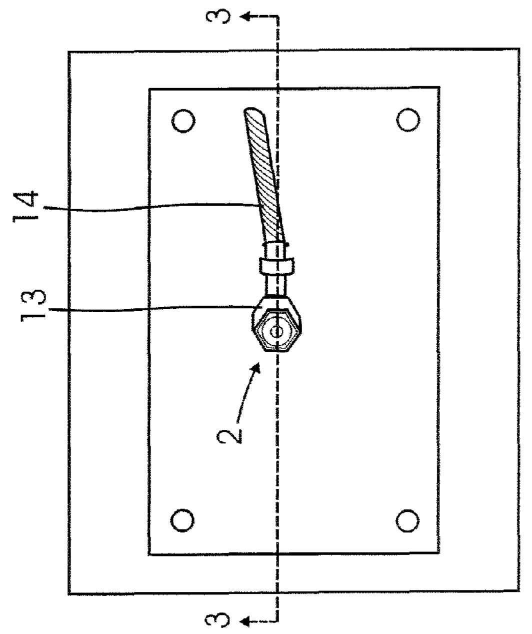
FIG. 5A is a top plan view of the ground stud and composite structure of FIG. 4A.
Figure 5B:
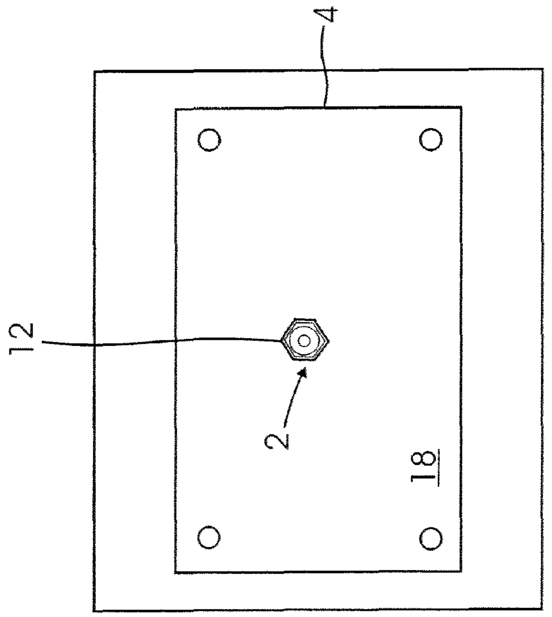
FIG. 5B is a bottom plan view of the ground stud and composite structure of FIG. 4A.

FIGS. 5A and 5B illustrate top plan and bottom plan views, respectively, of the present ground stud system including the composite structure 4. With reference to FIG. 5A, the conductive terminal 13 is secured to the ground stud 2 so that current can flow from the connection device 14 to the composite structure 4. With reference to FIG. 5B, the collar 12 secures the ground stud 2 at the lower surface 18 of the composite structure 4.

Figure 6:
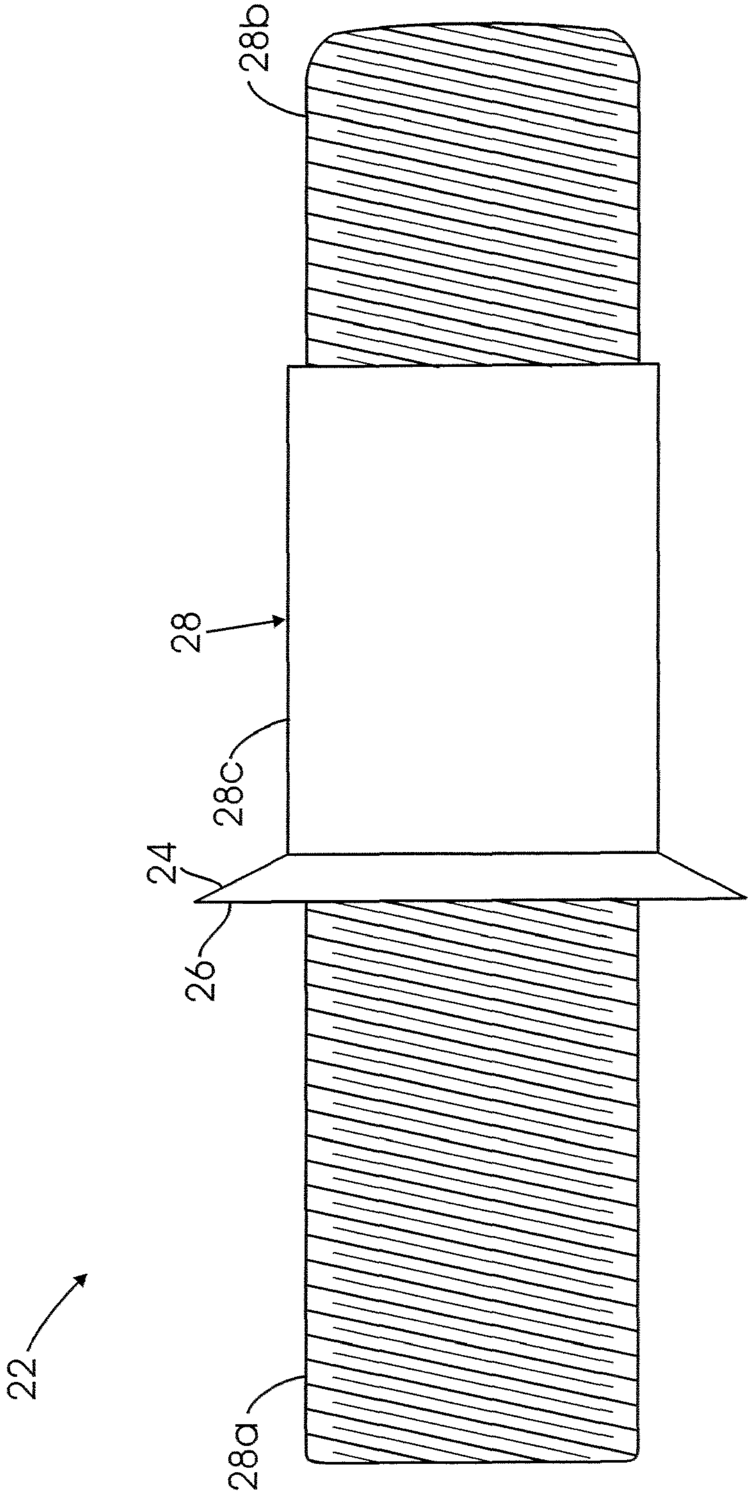
FIG. 6 is a front elevation view of another embodiment of the present ground stud.
Figure 7:
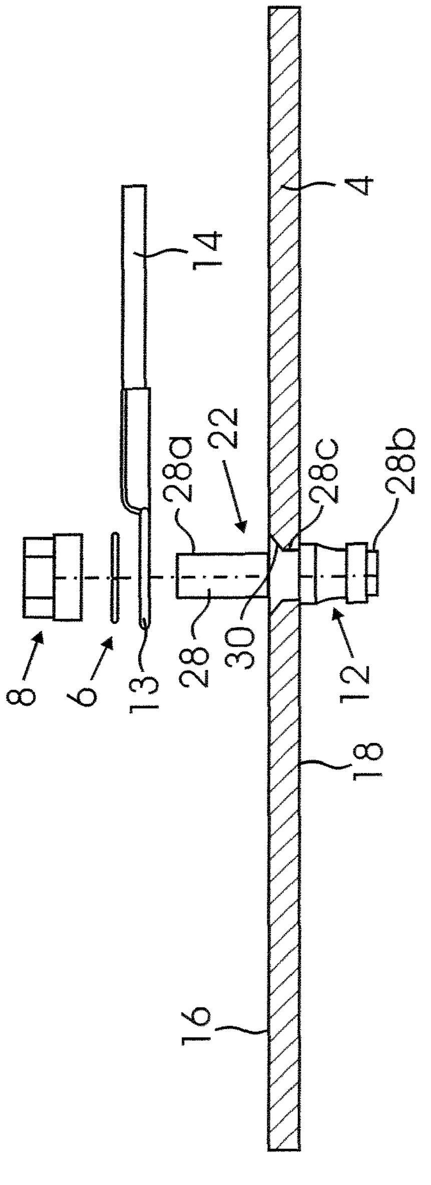
FIG. 7 is an exploded, cross-sectional, front elevation view of the ground stud of FIG. 6 and a composite structure.

FIG. 6 illustrates another embodiment of the present ground stud 22. The embodiment of FIG. 6 is similar in many respects to the ground stud 2 described and illustrated above. The ground stud 22 comprises a pin 28, having a first threaded end 28*a*, a second threaded end 28*b*, and a shoulder 26 with a tapered surface 24. In the ground stud 22 of FIG. 6 a surface 24 of the shoulder 26 that faces the second threaded end 28*b* of the pin 28 forms a non-orthogonal angle with the surface of the intermediate portion 28*c*. Thus, a thickness of the shoulder 26 tapers downward with increasing distance from the pin 28. The tapered surface 24 of the shoulder 26 forms a countersink 30 with the composite structure 4, as illustrated in FIG. 7. With the countersunk engagement of the ground stud 22 and the composite structure 4, tightening of the collar 12 forces electrical contact between the tapered surface 24 of the shoulder 26 (FIG. 6) and the conductive fibers in the composite structure 4 at the location of the countersink 30. The strong electrical contact in this region allows the ground stud 22 to effectively bleed off electrical charge regardless of the fit between the intermediate portion 28*c* and the hole in the composite structure 4. Thus, effective grounding can be achieved with the stud 22 of FIGS. 6 and 7 even if the fit between the intermediate portion 28*c* and the hole is interference, transition, or clearance.

In the illustrated embodiment of FIG. 7, the connective device 14 comprises a conductive terminal 13 that fits over and at least partially around the ground stud 22. Electrostatic current may flow from the connective device 14 to the ground stud 22 and the composite structure 4. In the illustrated embodiment, a pressure washer 6 and nut 8 engage the first threaded end 28*a* and sandwich the conductive terminal 13 between the washer 6 and the shoulder 26. The nut 8 may be self-locking.

A method of installing the ground stud 22 of FIGS. 6 and 7 may comprise drilling a hole in the composite structure 4 to accommodate the intermediate portion 28*c*, and drilling a countersink in the hole to accommodate the tapered shoulder 26. As discussed above, the drilling step advantageously exposes conductive fibers in the composite structure 4, facilitating strong electrical contact between the intermediate portion 28*c*, and the composite structure 4. Additionally, the tapered surface 24 and the countersink area of the hole are in electrical contact with each other, and the drilling step advantageously exposes conductive fibers in the countersunk portion of the composite structure 4, further strengthening the electrical contact between the ground stud 22 and the composite structure 4. Again, the fit between the intermediate portion 28*c* and the hole may be interference, transition, or clearance. The ground stud 22 may then be inserted into the hole and the collar 12 tightened down onto the second threaded end 28*b*. (FIG. 7).

The above description presents the best mode contemplated for carrying out the present ground stud installation on composite structures, and of the manner and process of making and using it, in such full, clear, concise, and exact terms as to enable any person skilled in the art to which it pertains to make and use this ground stud installation. This ground stud installation is, however, susceptible to modifications and alternate constructions from that discussed above that are fully equivalent. Consequently, this ground stud installation is not limited to the particular embodiments disclosed. On the contrary, this ground stud installation covers all modifications and alternate constructions coming within the spirit and scope of the ground stud installation as generally expressed by the following claims, which particularly point out and distinctly claim the subject matter of the ground stud installation.

What is claimed is:

1. A method for installing a ground stud in a composite structure, the method comprising the steps of:

drilling a hole in the composite structure;

drilling a countersink in the composite structure;

inserting the ground stud into the hole;

attaching a connective device to the ground stud such that the connective device is in electrical contact with the ground stud, wherein the connective device, the ground stud and the composite structure are configured to allow electrical current to flow from the connective device to the ground stud and then into the composite structure, and the connective device, the ground stud and the composite structure are further configured to allow electrical current to flow from the composite structure to the ground stud and then into the connective device; and positioning the ground stud including a pin, the pin having a shoulder located between a first threaded end and a second threaded end located on the ground stud, the pin further having a non-threaded portion located between the shoulder and the second threaded end, wherein positioning causes the non-threaded portion to be in electrical contact with conductive fibers within composite structure so that the shoulder engages the countersink.

2. The method of claim 1, wherein the steps of drilling a hole in the composite structure and drilling the countersink in the composite structure expose conductive fibers within the composite structure.

3. The method of claim 2, wherein the conductive fibers are carbon.

4. The method of claim 1, wherein an electrical bonding resistance between the ground stud and the composite structure is less than 1 ohm.

5. The method of claim 1, wherein the first threaded end and the second threaded end are coated.

6. The method of claim 1, wherein the ground stud is made of an electrically conductive material that is not electrochemically reactive with carbon.

7. The method of claim 1, wherein the ground stud is made of titanium or steel.

8. The method of claim 1, further comprising:

securing the ground stud to the composite structure; and attaching a collar onto the second threaded end.

* * * * *